US 7,940,366 B2

(12) United States Patent
Watanabe

(10) Patent No.: US 7,940,366 B2
(45) Date of Patent: May 10, 2011

(54) DISPLAY DEVICE INCLUDING SUBSTRATES BONDED TOGETHER THROUGH AN ADHESIVE

(75) Inventor: Noriko Watanabe, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 286 days.

(21) Appl. No.: 12/091,343

(22) PCT Filed: Jun. 30, 2006

(86) PCT No.: PCT/JP2006/313130
§ 371 (c)(1),
(2), (4) Date: Apr. 24, 2008

(87) PCT Pub. No.: WO2007/066424
PCT Pub. Date: Jun. 14, 2007

(65) Prior Publication Data
US 2009/0115942 A1 May 7, 2009

(30) Foreign Application Priority Data

Dec. 5, 2005 (JP) .................................. 2005-350887

(51) Int. Cl.
G02F 1/1339 (2006.01)
G02F 1/1345 (2006.01)
(52) U.S. Cl. ...................................... 349/153; 349/150
(58) Field of Classification Search .................. 349/151, 349/152, 149, 150, 153, 154
See application file for complete search history.

(56) References Cited

U.S. PATENT DOCUMENTS

| 4,394,067 A * | 7/1983 | Spruijt et al. ................. 349/153 |
| 6,819,376 B1 | 11/2004 | Muramatsu |
| 6,980,275 B1 * | 12/2005 | Konuma et al. ............... 349/154 |
| 7,126,655 B2 | 10/2006 | Muramatsu |
| 2004/0233366 A1* | 11/2004 | Kamosawa et al. ........... 349/137 |
| 2005/0206796 A1 | 9/2005 | Okabe |

FOREIGN PATENT DOCUMENTS

| EP | 0 871 060 A1 | 10/1998 |
| JP | 61-65287 A | 4/1986 |
| JP | 61-174514 A | 8/1986 |
| JP | 05-019268 A | 1/1993 |
| JP | 05-061028 A | 3/1993 |
| JP | 11-064863 A | 3/1999 |
| JP | 2000-258782 A | 9/2000 |
| JP | 2000-284270 A | 10/2000 |
| JP | 2001-091955 A | 4/2001 |
| JP | 2002-258294 A | 9/2002 |
| JP | 2003-280028 A | 10/2003 |
| JP | 2004-117540 A | 4/2004 |

OTHER PUBLICATIONS

Official communication issued in the International Application No. PCT/JP2006/313130, mailed on Aug. 1, 2006.

* cited by examiner

Primary Examiner — Mark A Robinson
Assistant Examiner — Michael Inadomi
(74) Attorney, Agent, or Firm — Keating & Bennett, LLP

(57) ABSTRACT

A display device is provided with a sealing member for sealing a liquid crystal layer between a flexible first substrate and a second substrate, a mounting region provided in a portion of the first substrate outside a display area in which the liquid crystal layer is sealed, the mounting region mounting a circuit component on at least a portion thereof, wherein the second substrate includes an extending region extending to face the mounting region and an adhesive arranged to bond the extending region and the mounting region is provided in at least a portion of a space between the extending region and the mounting region.

12 Claims, 18 Drawing Sheets

DISPLAY DEVICE INCLUDING SUBSTRATES BONDED TOGETHER THROUGH AN ADHESIVE

BACKGROUND OF THE INVENTION

1. Field of the Invention

The present invention relates to a display device having a flexible substrate.

2. Description of the Related Art

In recent years, active studies have been made of display devices such as liquid crystal devices and organic EL display devices. A glass plate is generally used in the display device to carry a display medium layer and the like. However, an attempt to use a flexible plastic plate has been made for the purposes of giving flexibility to the display device itself and reducing the thickness of the plate without deteriorating the plate strength.

Referring to a perspective view shown in FIG. 38, a common liquid crystal display device having a flexible plate will be explained. A liquid crystal display device 100 includes a first substrate 101, a second substrate 102 arranged to face the first substrate 101 and a liquid crystal layer as a display medium layer sealed between the first and second substrates 101 and 102 with a sealing member 103.

The first substrate 101 includes a plastic plate 111. A plurality of thin film transistors (TFTs, not shown) are formed on the surface of the plastic plate 111 facing the liquid crystal layer. Part of the first substrate 101 inside the sealing member 103 in which the liquid crystal layer is provided functions as a display area 120 which contributes to display. Further, part of the first substrate 101 outside the display area 120 serves as a mounting region 106 on which a driver IC chip 104 and a flexible printed circuit (FPC) 105 are mounted.

The second substrate 102 includes a plastic plate 112 and a polarizer 113 stacked on the surface of the plastic plate 112 facing outside (opposite the liquid crystal layer). In general, the second substrate 102 is shaped substantially the same as the display area 120. The mounting region 106 of the first substrate 101 protrudes outward beyond the edge of the second substrate 102 when viewed in plan.

As the plastic plates 111 and 112 are flexible, they are relatively greatly deformed even when a slight external force is applied thereto in the manufacture or use of the display device. There is a known technique of preventing the FPC from falling off due to the plate deformation by bonding a reinforcing plate separate from the other components with an adhesive such that the reinforcing plate overlaps part of the FPC bonded to the plastic plate (see, for example, Japanese Unexamined Patent Publication No. 61-65287). In the structure according to Japanese Unexamined Patent Publication No. 61-65287, a bottom surface of the bonded part of the FPC is bonded to the plastic plate with an anisotropic conductive connector interposed therebetween and a top surface of the bonded part of the FPC is bonded to the separate reinforcing plate with an adhesive. In this way, the adhesion of the FPC to the plastic plate is increased.

The mounting region 106 is made of a single plastic plate 111. Therefore, the mounting region 106 is less strong than the display area 120 made of the two plastic plates 111 and 112 bonded together and is prone to be relatively greatly deformed. As a result, when an external force is applied to the mounting region 106, bending stress is likely to concentrate on part of the plastic plate on which the sealing member 103 is provided as shown in the sectional view of FIG. 39.

The sealing member is generally harder than the flexible plastic plate and is less likely to be deformed. Therefore, the sealing member cannot be deformed along with the deformation of the flexible plate. That is, in the conventional display device, there is a possibility that the sealing member may fall off the flexible plate and a malfunction such as display failure may occur.

The reinforcing plate according to Japanese Unexamined Patent Publication No. 61-65287 is provided as a component separate from the other components (e.g., the second substrate). Therefore, the reinforcing plate is not effective at all against the bending stress concentrated on the part of the plate on which the sealing member is provided. To be more specific, it is difficult to prevent the sealing member from falling off with use of the reinforcing plate.

SUMMARY OF THE INVENTION

In order to overcome the problems described above, preferred embodiments of the present invention prevent a sealing member from falling off a flexible plate and also prevent any reduction in display quality.

A preferred embodiment of the present invention is configured to provide an adhesive in at least a portion of a space between a mounting region of a first substrate and an extending region of a second substrate.

More specifically, a display device according to a preferred embodiment of the present invention includes: a flexible first substrate including a plurality of switching elements located thereon; a second substrate arranged to face the first substrate; a sealing member arranged to seal a display medium layer between the first substrate and the second substrate; and a mounting region provided in a portion of the first substrate outside a display area in which the display medium layer is sealed, the mounting region mounting on at least a portion thereof a circuit component electrically connected to the switching elements, wherein the second substrate includes an extending region extending to face the mounting region of the first substrate and an adhesive arranged to bond the extending region and the mounting region is provided in at least a portion of a space between the extending region and the mounting region.

It is preferable that at least one of surfaces of the mounting region and the extending region in contact with the adhesive is roughened.

A through hole may be formed in a portion of at least one of the mounting region and the extending region in contact with the adhesive and the through hole may be filled with the adhesive.

It is preferable that the second substrate includes a polarizer and the extending region includes a portion of the polarizer.

The second substrate may include a polarizer and a transparent plate stacked on a surface of the polarizer opposite the display medium layer and the extending region may include a portion of the transparent plate.

The second substrate may include a polarizer and a flexible plate stacked on a surface of the polarizer facing the display medium layer and the extending region may include a portion of the flexible plate.

It is preferable that the extending region is configured to protrude outward beyond the mounting region.

An opening in which at least a portion of the circuit component is inserted may be formed in the second substrate.

It is preferable that the adhesive fills the entire space between the extending region and the mounting region overlapping each other.

The adhesive may be provided in an edge portion of the space between the extending region and the mounting region overlapping each other, the edge portion being on the edge of the space opposite the display area.

The circuit component may include an IC chip mounted on the middle of the mounting region and a flexible plate mounted on the edge of the mounting region and the adhesive may be provided to fill at least space between the IC chip and the flexible plate.

The adhesive may be provided to fill at least a portion of an edge portion of the space between the extending region and the mounting region overlapping each other.

The display medium layer may be a liquid crystal layer or an organic EL layer.

In the display area of the display device, the first substrate and the second substrate are arranged to face each other with the display medium layer interposed therebetween. In the mounting region of the display device outside the display area, the first substrate and the extending region are arranged to face each other with the adhesive interposed therebetween. The first substrate is shared by the display area and the mounting region and the extending region is an integral part of the second substrate. Therefore, the mounting region is provided with a bending strength that is equal to or higher than that of the display area.

Specifically, when an external force is applied to the mounting region, the mounting region is bent in a continuous manner with the second substrate and the display area. Therefore, unlike the conventional case, bending stress is not concentrated on a portion of the first substrate on which the sealing member is provided. Therefore, the sealing member is less likely to fall off and the reduction of display quality is prevented.

If at least one of the surfaces of the mounting region and the extending region in contact with the adhesive is roughened, adhesion between the roughened surface of the mounting region or the extending region and the adhesive is enhanced. Further, if a through hole is formed in a portion of at least one of the mounting region and the extending region in contact with the adhesive and the through hole is filled with the adhesive, the adhesion is also enhanced.

The extending region may include a portion of a polarizer, a portion of a transparent plate stacked on a surface of the polarizer opposite the display medium layer or a portion of a flexible plate stacked on a surface of the polarizer facing the display medium layer. It is preferable that the extending region includes a portion of the polarizer or the flexible plate because the extending region is provided using a portion of the existing component. If the circuit component is relatively thick, it is preferable that the extending region includes a portion of the transparent plate.

If the adhesive fills the entire space between the extending region and the mounting region overlapping each other, the strength of the extending and mounting regions overlapping each other is maximized. Further, if the adhesive is arranged to fill an edge portion of the space between the extending region and the mounting region overlapping each other, the edge portion being on the edge of the space opposite the display area, or the adhesive is arranged to fill at least space between the IC chip and the flexible plate, the strength of the extending and mounting regions overlapping each other is efficiently enhanced.

According to preferred embodiments of the present invention, the adhesive for bonding the mounting region of the first substrate and the extending region of the second substrate is provided in at least a portion of space between the mounting region and the extending region. This makes it possible to prevent the concentration of bending stress on a portion of the first substrate on which the sealing member is provided. Therefore, the sealing member is less likely to fall off and the reduction of display quality is prevented.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention will be explained in detail with reference to the drawings. However, the present invention is not limited to the following preferred embodiments.

First Preferred Embodiment

Figure 1:
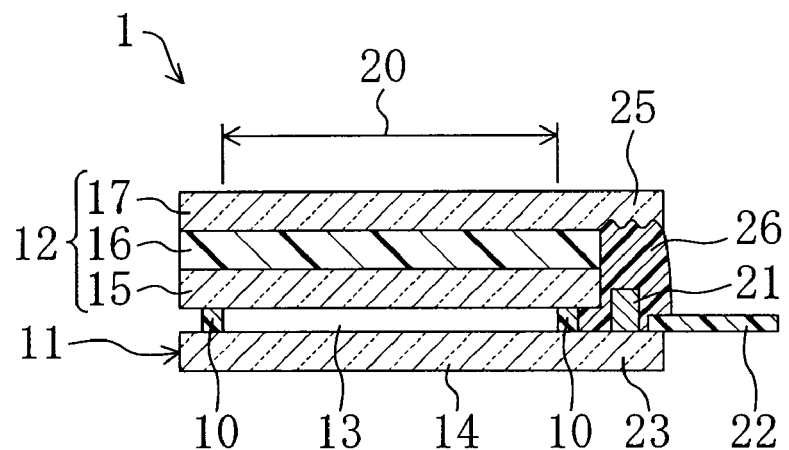
FIG. 1 is a sectional view illustrating the schematic structure of a liquid crystal display device according to a first preferred embodiment of the present invention.
Figure 2:
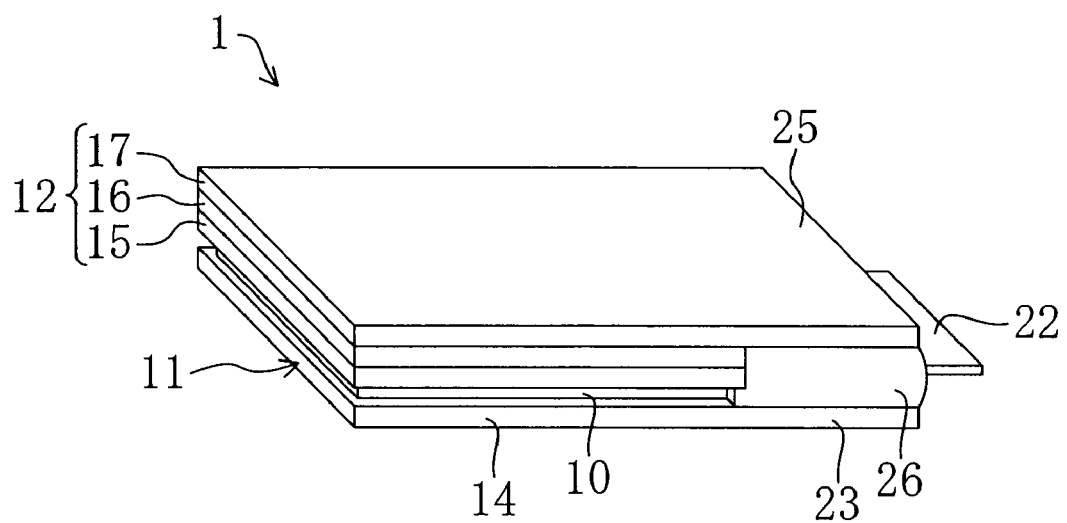
FIG. 2 is a perspective view illustrating the liquid crystal display device according to the first preferred embodiment of the present invention.

FIGS. 1 to 7 show a first preferred embodiment of the present invention. FIG. 1 is a sectional view illustrating the schematic structure of a liquid crystal display device 1, FIG. 2 is a perspective view of the liquid crystal display device 1 and FIGS. 3 to 7 are sectional views illustrating the steps of manufacturing the liquid crystal display device 1.

As shown in FIGS. 1 and 2, the liquid crystal display device 1 includes a flexible first substrate 11 on which TFTs (not shown) are formed as a plurality of switching elements, a second substrate 12 arranged to face the first substrate 11 and a liquid crystal layer 13 as a display medium layer provided between the first substrate 11 and the second substrate 12. Though not shown, a backlight unit as a light source is provided on the side of the first substrate 11 opposite the liquid crystal layer 13. The liquid crystal display device 1 preferably is a transmissive liquid crystal display device which performs transmissive display with use of light emitted from the backlight unit. However, the liquid crystal display device 1 is not limited thereto and it may be a reflective liquid crystal display device which performs display by reflecting ambient light.

The liquid crystal layer 13 is sealed between the first substrate 11 and the second substrate 12 with a rectangular or substantially rectangular ring-shaped sealing member 10. For example, XN-21S manufactured by Mitsui Chemicals, Inc. of about 1-2 mm width and about 5 μm thick, for example, is preferably used as the sealing member 10. The sealing member 10 may be made of, for example, a photo-curing resin or a thermosetting resin. An area in which the liquid crystal layer 13 is sealed with the sealing member 10 serves as a display area 20 which contributes to display.

The first substrate 11 includes a rectangular or substantially rectangular, transparent and flexible plastic plate 14. The first substrate 11 has a plurality of pixel regions arranged in a matrix pattern (not shown) and the TFTs are provided in the pixel regions, respectively. Each of the pixel regions includes a pixel electrode connected to the TFT to drive the liquid crystal layer. An alignment film (not shown) for controlling the alignment of liquid crystal molecules in the liquid crystal layer 13 is formed on the plastic plate 14 to cover the pixel electrodes and the TFTs. The plastic plate 14 carries a polarizer (not shown) stacked on the surface thereof opposite the liquid crystal layer 13.

For example, the plastic plate 14 is preferably made of PES (polyethersulfone) and has a thickness of about 250 μm, for example. The plastic plate 14 may be made of other resins such as PET (polyethylene terephthalate) and PEN (polyethylene naphthalate) or composite materials prepared by combining the resin with fiber or fiber cloth made of carbon or glass. The thickness of the plastic plate 14 is preferably about 50 μm to about 300 μm, both inclusive, for example.

The first substrate 11 further includes a mounting region 23 located outside the display area 20 for mounting on at least a portion thereof circuit components 21 and 22 electrically connected to the TFTs. More specifically, the mounting region 23 preferably is a portion of the first substrate 11 laterally protruding from the side of the sealing member 10 and rectangular-shaped when viewed in plan.

The circuit components 21 and 22 preferably are an IC chip 21 as a driver circuit and an FPC 22 as a flexible plate. The FPC 22 is mounted on the edge of the mounting region 23 and extends in the lateral direction. The FPC 22 is electrically connected to the IC chip 21 and supplies an electric signal to the IC chip 21. The IC chip 21 is mounted on the middle of the mounting region 23 and supplies a control signal generated based on the electric signal supplied from the FPC 22 to the TFTs. The IC chip 21 and the FPC 22 are arranged adjacent to each other as shown in FIG. 1.

The IC chip 21 may be made of a silicon plate having a thickness of about 150 μm to 200 μm, both inclusive, and a width of about 2 mm, for example. The FPC 22 may be made of a flexible plate such as a polyimide film having a thickness of about 100 μm and connected to terminals (not shown) formed on the mounting region 23 via an ACF (anisotropic conductive film). The circuit component 21 is not limited to the IC chip. For example, it may be a circuit directly formed in the plastic plate 14.

The second substrate 12 includes a transparent flexible plastic plate 15, as well as a polarizer 16 and a transparent plate 17 stacked in this order on the surface of the plastic plate 15 opposite the liquid crystal layer 13. On the surface of the plastic plate 15 facing the liquid crystal layer 13, a common transparent electrode made of ITO (not shown) and a color filter (not shown) are provided. The material and thickness of the plastic plate 15 are the same as those of the plastic plate 14 of the first substrate 11.

The polarizer 16 is shaped substantially the same as the plastic plate 15 and stacked on the plastic plate 15 such that they exactly overlap each other when viewed in plan. An absorption axis of the polarizer 16 is substantially orthogonal to that of the polarizer of the first substrate 11. The polarizer 16 is preferably prepared by sandwiching iodine-stained and drawn PVA (polyvinyl alcohol) with TAC (cellulose triacetate) protective films. The thickness of the polarizer 16 is preferably about 100 μm to about 200 μm, both inclusive, for example.

The material and thickness of the transparent plate 17 are the same as those of the plastic plate 15 of the second substrate 12. The material and thickness of the transparent plate 17 are not particularly limited as long as the transparency is ensured.

The second substrate 12 includes an extending region 25 extending to face the mounting region 23 of the first substrate 11. A resin 26 as an adhesive for bonding the extending region 25 and the mounting region 23 is provided in at least a portion of a space between the extending region 25 and the mounting region 23.

The extending region 25 includes a portion of the transparent plate 17. The extending region 25 is shaped substantially the same as the mounting region 23 such that they exactly overlap each other when viewed in plan. That is, the transparent plate 17 is shaped substantially the same as the plastic plate 14 of the first substrate 11 such that they exactly overlap each other when viewed in plan. The surface of the extending region 25 facing the first substrate 11 is preferably roughened to have a relatively high surface roughness.

At least one of the surfaces of the mounting region 23 and the extending region 25 in contact with the resin 26 may be roughened. Specifically, only a portion of the surface in contact with the resin 26 may be roughened. Alternatively, the entire surface of the extending region 25 facing the mounting region 23 may be roughened or the entire surface of the mounting region 23 facing the extending region 25 may be roughened.

Figure 30:
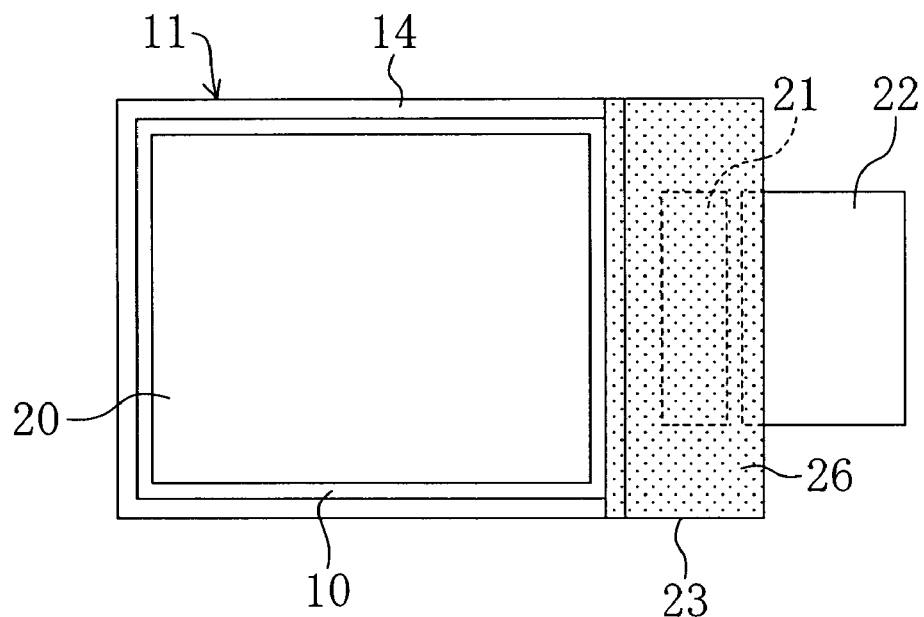
FIG. 30 is a plan view illustrating the liquid crystal display device of the first preferred embodiment from which a second substrate is omitted.

The resin 26 may be a photo-curing resin which cures upon exposure to light such as ultraviolet light, a thermosetting resin or a thermoplastic resin. For example, a photo-curing resin TF-3348-15F3C manufactured by Hitachi Chemical, Co., Ltd. may be used as the resin 26. As shown in a plan view of FIG. 30 illustrating the liquid crystal display device 1 from which the second substrate 12 is omitted, the resin 26 fills the entire space between the extending region 25 and the mounting region 23 overlapping each other. As a result, the outer side of the sealing member 10 and a connection between the IC chip 21 and the FPC 22 are covered with the resin 26.

Manufacturing Method

Then, a method for manufacturing the liquid crystal display device 1 will be described with reference to FIGS. 3 to 7.

Figure 3:
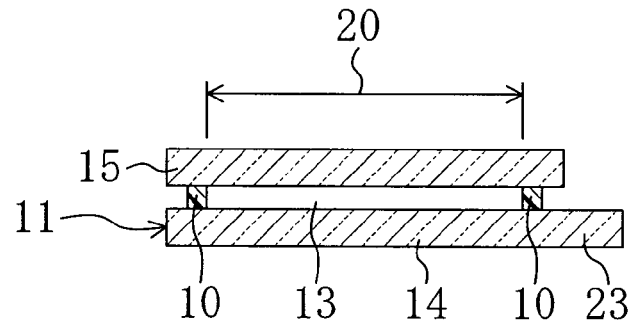
FIG. 3 is a sectional view illustrating a step of manufacturing the liquid crystal display device according to the first preferred embodiment of the present invention.

First, as shown in FIG. 3, the plastic plate 14 provided with circuits such as TFTs and an alignment film and the plastic plate 15 provided with a common electrode and the like are bonded together with the sealing member 10 interposed therebetween and a liquid crystal layer 13 is sealed between the plastic plates 14 and 15. A portion of the surface of the plastic plate 15 to serve as the extending region 25 facing the mounting region 23 is preferably roughened by laser application or etching.

Figure 4:
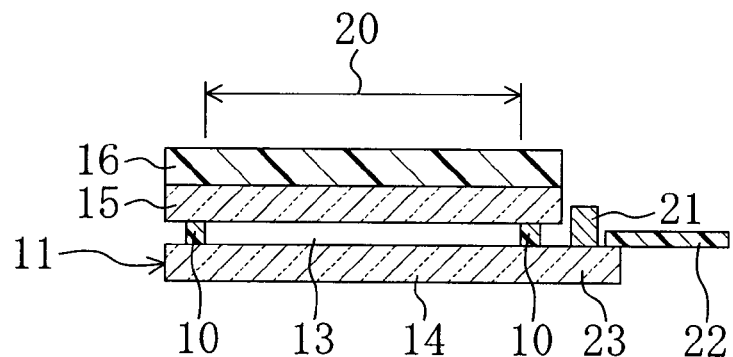
FIG. 4 is a sectional view illustrating a step of manufacturing the liquid crystal display device according to the first preferred embodiment of the present invention.

Then, as shown in FIG. 4, a polarizer (not shown) is bonded to the plastic plate 14 and a polarizer 16 is bonded to the plastic plate 15. The polarizer 16 is shaped substantially the same as the plastic plate 15. Then, the IC chip 21 and the FPC 22 are mounted on the mounting region 23 of the plastic plate 14.

Figure 5:
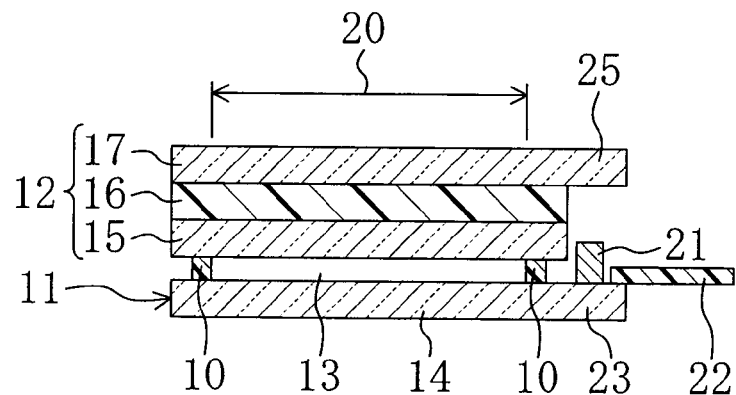
FIG. 5 is a sectional view illustrating a step of manufacturing the liquid crystal display device according to the first preferred embodiment of the present invention.
Figure 6:
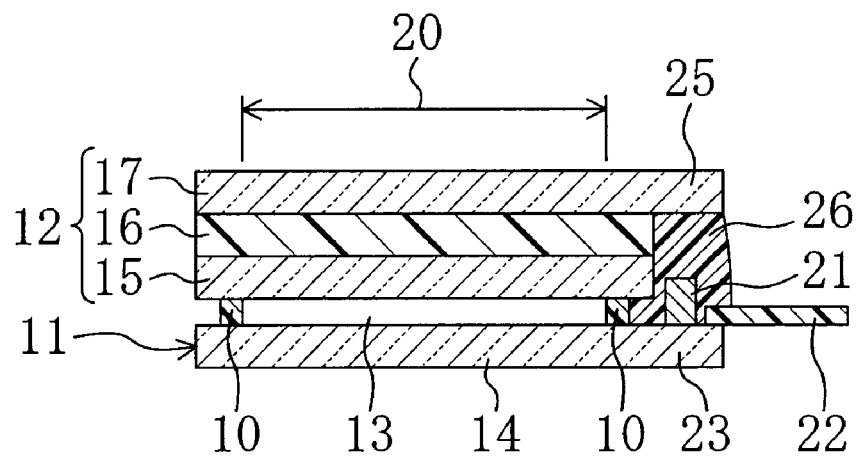
FIG. 6 is a sectional view illustrating a step of manufacturing the liquid crystal display device according to the first preferred embodiment of the present invention.

Then, as shown in FIG. 5, the transparent plate 17 shaped substantially the same as the plastic plate 14 is bonded to the polarizer 16 such that the transparent plate 17 exactly overlaps the plastic plate 14 when viewed in plan.

Figure 7:
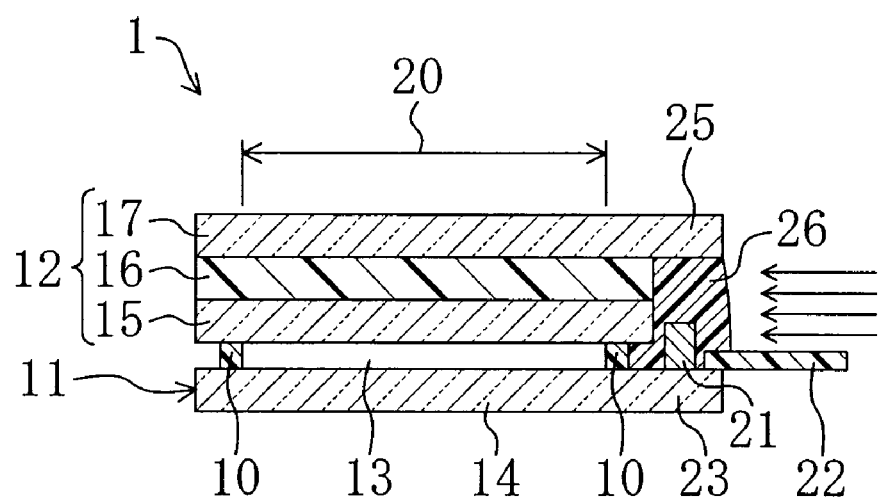
FIG. 7 is a sectional view illustrating a step of manufacturing the liquid crystal display device according to the first preferred embodiment of the present invention.

Then, the resin 26 is supplied between the extending region 25 of the transparent plate 17 extending laterally from the edge of the polarizer 16 and the mounting region 23 facing the extending region 25. As described above, TF-3348-15F3C manufactured by Hitachi Chemical, Co., Ltd. is preferably used as the resin 26. Since the resin 26 is in a liquid state, it is easily introduced between the mounting region 23 and the extending region 25. Then, as shown in FIG. 7, ultraviolet light is applied to the resin 26 at an intensity of about 2 J/cm$^2$, for example, to cure the resin. If a thermosetting resin is used as the resin 26, the resin 26 supplied between the mounting region 23 and the extending region 25 is heated to cure the resin 26. According to these steps, the liquid crystal display device 1 is manufactured.

Effects and Advantages of First Preferred Embodiment

According to the first preferred embodiment, the resin 26 for bonding the extending region 25 and the mounting region 23 is provided between the mounting region 23 of the first substrate 11 and the extending region 25 of the second substrate 12. This prevents the concentration of bending stress on part of the first substrate 11 on which the sealing member 10 is provided. Therefore, the sealing member 10 is less likely to fall off and the reduction of display quality is prevented.

The first substrate 11 is shared by the display area 20 and the mounting region 23 and the extending region 25 is an integral part of the second substrate 12. Therefore, the bending strength of the mounting region 23 is equal to or higher than that of the display area 20.

When an external force is applied to the mounting region 23, the mounting region 23 is bent continuously with the second substrate 12 and the display area 20. Therefore, unlike the conventional case, the bending stress is not concentrated on a portion of the first substrate 11 on which the sealing member 10 is provided. Thus, the sealing member 10 is less likely to fall off.

Since the surface of the extending region 25 in contact with the resin 26 is roughened, contact area between the extending region 25 and the resin 26 is increased and adhesion between the extending region 25 and the resin 26 is enhanced. Further, owing to the transparent plate 17 stacked on the outer surface of the second substrate 12 (the surface opposite the liquid crystal layer 13), the extending region 25 is easily formed even if the circuit components 21 and 22 are relatively thick.

Additionally, as the resin 26 fills the entire space between the extending region 25 and the mounting region 23 overlapping each other, the plate strength is effectively enhanced in a portion thereof where the extending region 25 and the mounting region 23 overlap each other.

Second Preferred Embodiment

Figure 8:
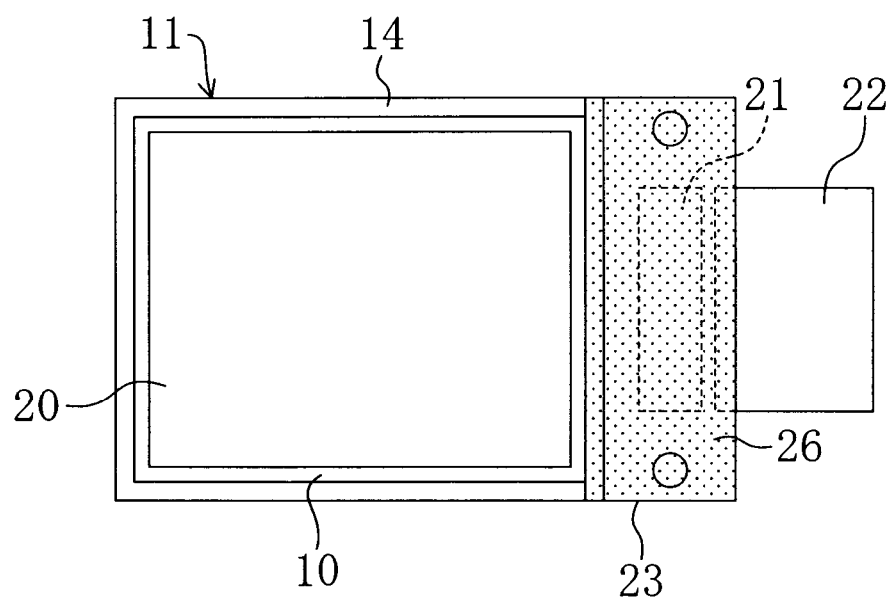
FIG. 8 is a plan view illustrating a liquid crystal display device of a second preferred embodiment from which a second substrate is omitted.
Figure 9:
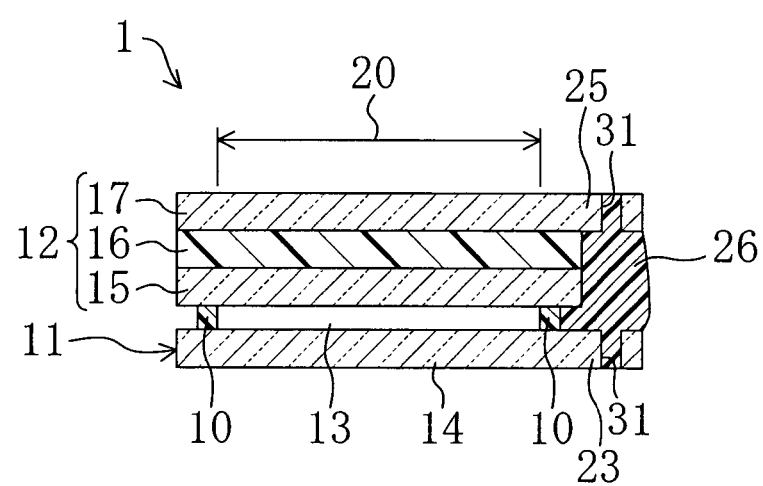
FIG. 9 is a sectional view illustrating the schematic structure of the liquid crystal display device according to the second preferred embodiment of the present invention.

FIGS. 8 and 9 show a second preferred embodiment of the present invention. FIG. 8 is a plan view illustrating a liquid crystal display device 1 from which a second substrate 12 is omitted and FIG. 9 is a sectional view illustrating the schematic structure of the liquid crystal display device 1. In the following preferred embodiments, the same components as those shown in FIGS. 1 to 7 are indicated by the same reference numerals to omit detailed explanation.

In the liquid crystal display device 1 of the present preferred embodiment, through holes 31 are formed in the extending region 25 and the mounting region 23 as shown in FIGS. 8 and 9 instead of roughening the surface of the extending region 25. The through holes 31 are formed in parts of the extending region 25 and the mounting region 23 in contact with the resin 26. According to the present preferred embodiment, two through holes 31 each having a circular or substantially circular section are formed at a certain interval to sandwich the circuit components 21 and 22. As shown in FIG. 9, the resin 26 is continuously introduced in the space between the extending region 25 and the mounting region 23 and the through holes 31. The through holes 31 to be filled with the resin 26 are formed in at least one of portions of the mounting region 23 and the extending region 25 in contact with the resin 26. Alternatively, at least one of the mounting region 23 and the extending region 25 may be provided with both of the through holes 31 and the roughened surface.

For the manufacture of the liquid crystal display device 1, the through holes 31 are formed in the plastic plates 14 and 15 and then the plastic plates 14 and 15 are bonded together. Thereafter, the resin 26 may be supplied from the side of the extending region 25 and the mounting region 23, as well as from the outside of the through holes 31. Then, the resin 26 is cured.

With the provision of the through holes 31, the adhesion between the resin 26 and the extending region 25 and the mounting region 23 is enhanced. From the aspect of higher adhesion, it is preferable to provide multiple through holes 31. The through hole 31 in the extending region 25 and the through hole 31 in the mounting region 23 may or may not overlap each other when viewed in plan.

Third Preferred Embodiment

Figure 10:
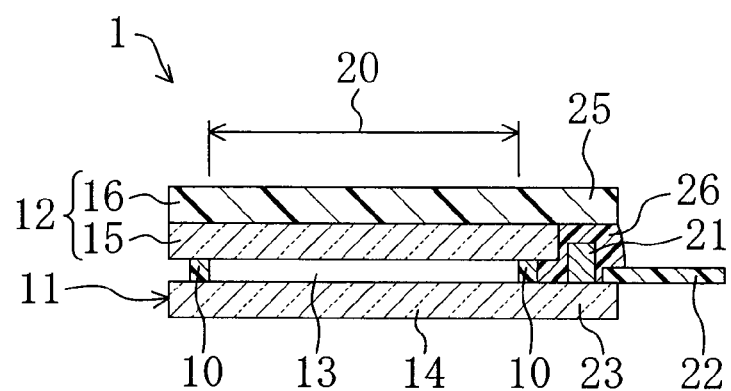
FIG. 10 is a sectional view illustrating the schematic structure of a liquid crystal display device according to a third preferred embodiment of the present invention.
Figure 11:
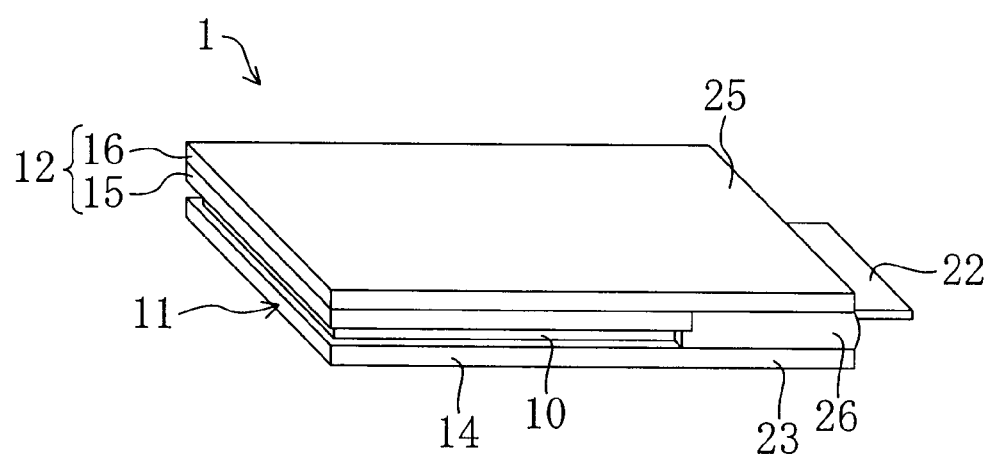
FIG. 11 is a perspective view illustrating the liquid crystal display device according to the third preferred embodiment of the present invention.

FIGS. 10 to 16 show a third preferred embodiment of the present invention. FIG. 10 is a sectional view illustrating the schematic structure of a liquid crystal display device 1, FIG. 11 is a perspective view illustrating the appearance of the liquid crystal display device 1 and FIGS. 12 to 16 are sectional views illustrating the steps of manufacturing the liquid crystal display device 1.

Different from the first preferred embodiment in which the extending region 25 consists of a portion of the transparent plate 17, the extending region 25 of the present preferred embodiment includes a portion of the polarizer 16. In general, the shape of the polarizer preferably is substantially the same as that of the plastic plate 15 of the second substrate 12. However, the polarizer 16 of the present preferred embodiment preferably is shaped substantially the same as the plastic plate 14 of the first substrate 11 and stacked on the plastic plate 15 of the second substrate 12 as shown in FIG. 11. The polarizer 16 is arranged to exactly overlap the plastic plate 14 when viewed in plan. Further, the resin 26 is provided to fill the space between the extending region 25 of the polarizer 16 and the mounting region 23 as shown in FIG. 10.

Figure 12:
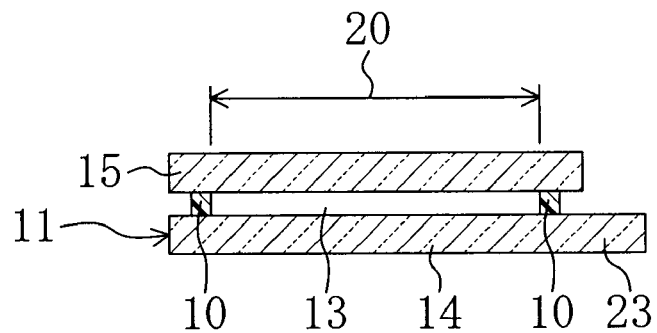
FIG. 12 is a sectional view illustrating a step of manufacturing the liquid crystal display device according to the third preferred embodiment of the present invention.

For the manufacture of the liquid crystal display device 1, as shown in FIG. 12, the plastic plate 14 provided with circuits such as TFTs and an alignment film is bonded to the plastic plate 15 provided with a common electrode and the like with the sealing member 10 interposed therebetween and the liquid crystal layer 13 is sealed between the plastic plates 14 and 15.

Figure 13:
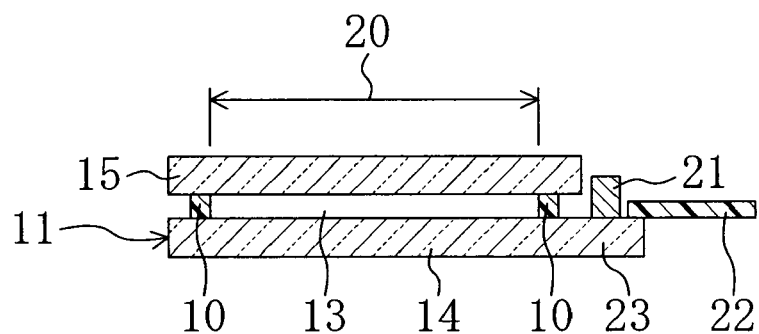
FIG. 13 is a sectional view illustrating a step of manufacturing the liquid crystal display device according to the third preferred embodiment of the present invention.
Figure 14:
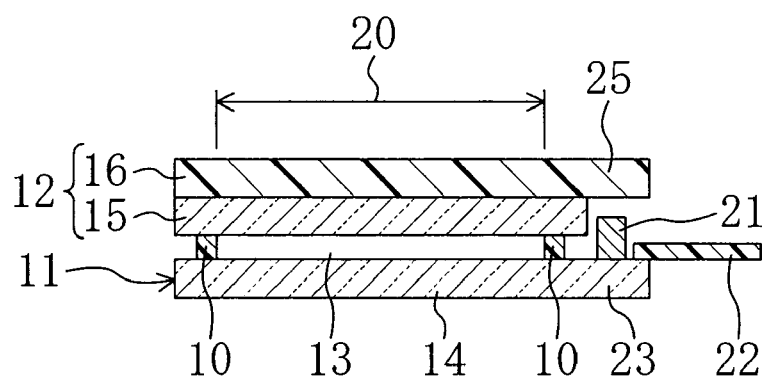
FIG. 14 is a sectional view illustrating a step of manufacturing the liquid crystal display device according to the third preferred embodiment of the present invention.

Then, as shown in FIG. 13, the IC chip 21 and the FPC 22 are mounted on the mounting region 23 of the plastic plate 14. Then, as shown in FIG. 14, the polarizer 16 is bonded to the plastic plate 15. The shape of the polarizer 16 is substantially the same as that of the plastic plate 14.

Figure 15:
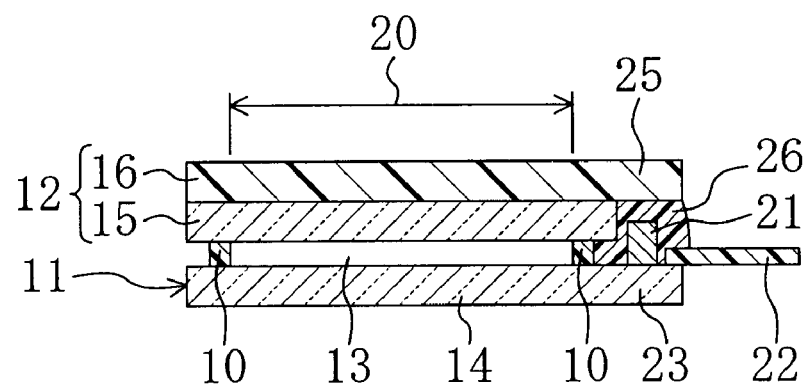
FIG. 15 is a sectional view illustrating a step of manufacturing the liquid crystal display device according to the third preferred embodiment of the present invention.
Figure 16:
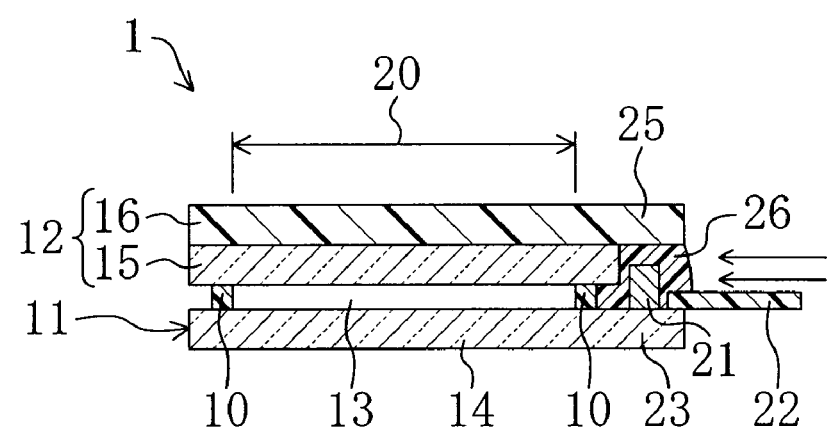
FIG. 16 is a sectional view illustrating a step of manufacturing the liquid crystal display device according to the third preferred embodiment of the present invention.

Then, as shown in FIG. 15, the resin 26 is supplied between the extending region 25 of the polarizer 16 protruding laterally from the edge of the plastic plate 15 and the mounting region 23 facing the extending region 25. As described above, TF-3348-15F3C manufactured by Hitachi Chemical, Co., Ltd. is used as the resin 26. Then, as shown in FIG. 16, ultraviolet light is applied to the resin 26 at an intensity of about 2 j/cm$^2$, for example, to cure the resin.

According to the present preferred embodiment, the same effects and advantages as those of the first preferred embodiment is obtained. The present preferred embodiment is preferable in that the extending region 25 is provided using the polarizer 16 of the liquid crystal display device 1 and there is no need to provide an additional component.

Fourth Preferred Embodiment

Figure 17:
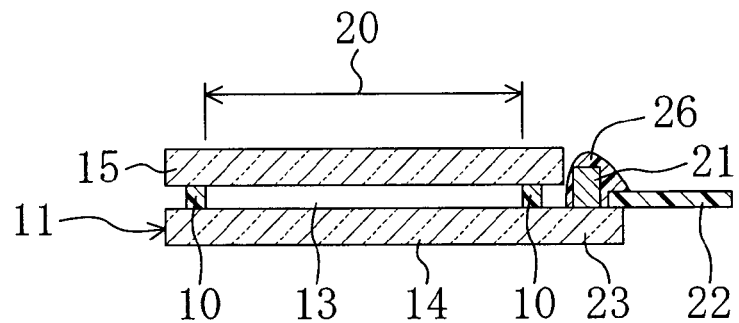
FIG. 17 is a sectional view illustrating a step of manufacturing a liquid crystal display device according to a fourth preferred embodiment of the present invention.
Figure 18:
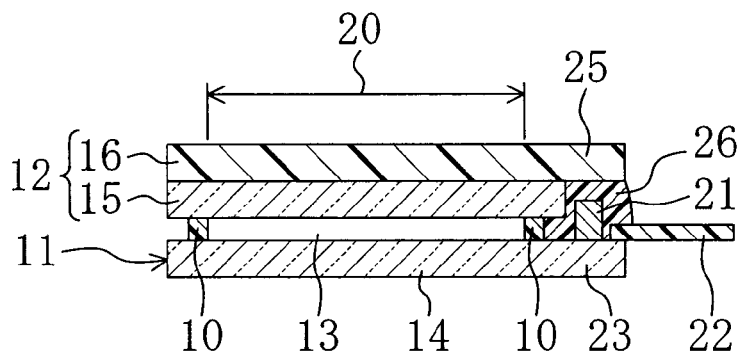
FIG. 18 is a sectional view illustrating a step of manufacturing the liquid crystal display device according to the fourth preferred embodiment of the present invention.
Figure 19:
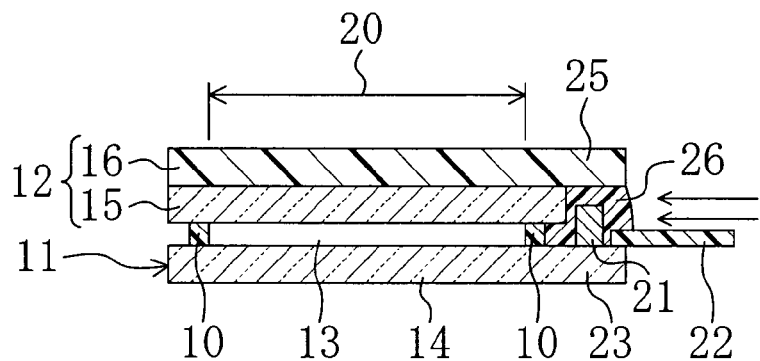
FIG. 19 is a sectional view illustrating a step of manufacturing the liquid crystal display device according to the fourth preferred embodiment of the present invention.

FIGS. 17 to 19 show a fourth preferred embodiment of the present invention. FIGS. 17 to 19 are sectional views illustrating the steps of manufacturing a liquid crystal display device 1.

The present preferred embodiment is different from the third preferred embodiment in that the step of bonding the polarizer 16 including the extending region 25 to the plastic plate 15 and the step of supplying the resin 26 in the space between the extending region 25 and the mounting region 23 are carried out in a reverse order.

First, as shown in FIG. 17, the plastic plates 14 and 15 are bonded together with the liquid crystal layer 13 interposed therebetween. Then, the resin 26, e.g., a photo-curing resin having relatively high viscosity, is supplied onto the mounting region 23. Subsequently, as shown in FIG. 18, the polarizer 16 is bonded to the plastic plate 15. The polarizer 16 is shaped substantially the same as the plastic plate 14. As a result, the resin 26 is pressed and spread by the polarizer 16 to fill the space between the extending region 25 and the mounting region 23. Then, ultraviolet light is applied to the resin 26 to cure the resin. The same effect as that of the first preferred embodiment is also obtained in this manner.

The resin 26 of the present preferred embodiment may be a thermosetting resin. While the thermosetting resin 26 provided on the mounting region 23 is heated and softened, the polarizer 16 is bonded to the plastic plate 15. As result, the resin 26 is pressed and spread by the polarizer 16 such that the resin fills the space between the extending region 25 and the mounting region 23 in the same manner as described above. Then, the resin 26 is cooled to cure.

In the first preferred embodiment, the transparent plate 17 including the extending region 25 is bonded to the polarizer 16 and then the resin 26 is supplied between the extending region 25 and the mounting region 23. However, in the same manner as the present preferred embodiment, the transparent plate 17 of the first preferred embodiment may be bonded after the resin 26 is supplied.

Fifth Preferred Embodiment

Figure 20:
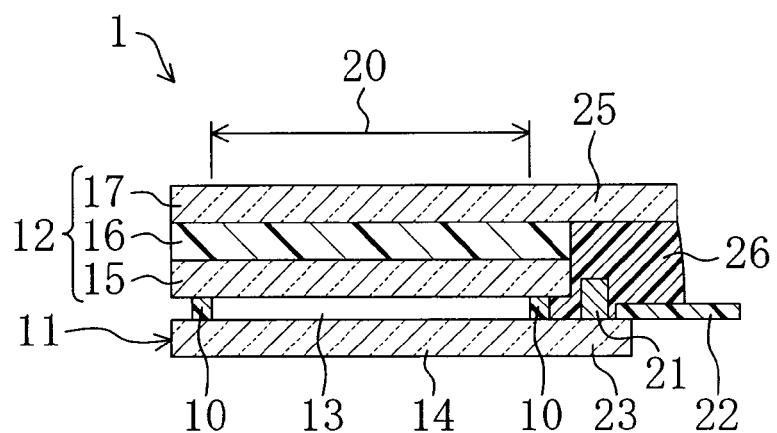
FIG. 20 is a sectional view illustrating the schematic structure of a liquid crystal display device according to a fifth preferred embodiment of the present invention.
Figure 21:
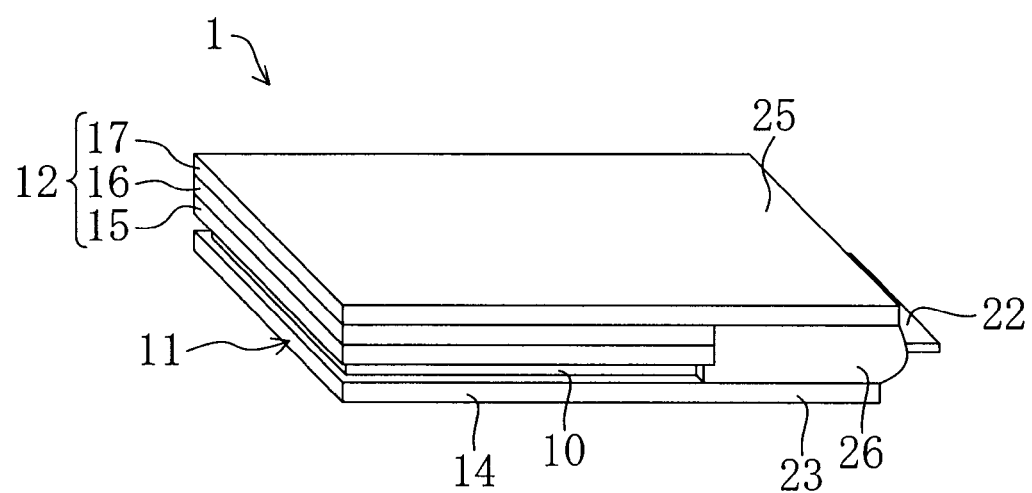
FIG. 21 is a perspective view of the liquid crystal display device according to the fifth preferred embodiment of the present invention.
Figure 22:
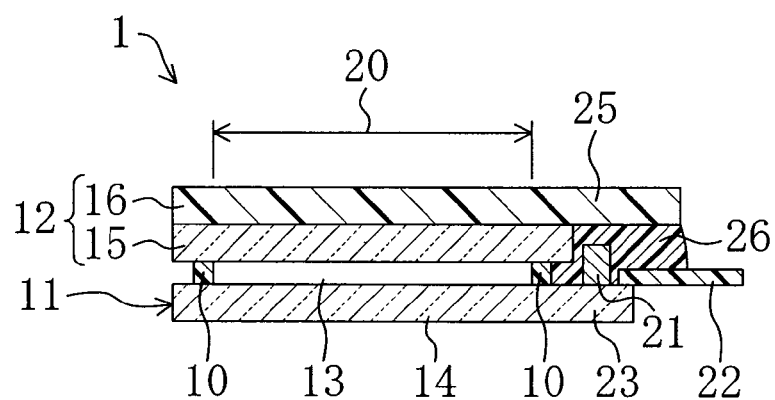
FIG. 22 is a sectional view illustrating the schematic structure of the liquid crystal display device according to the fifth preferred embodiment of the present invention.
Figure 23:
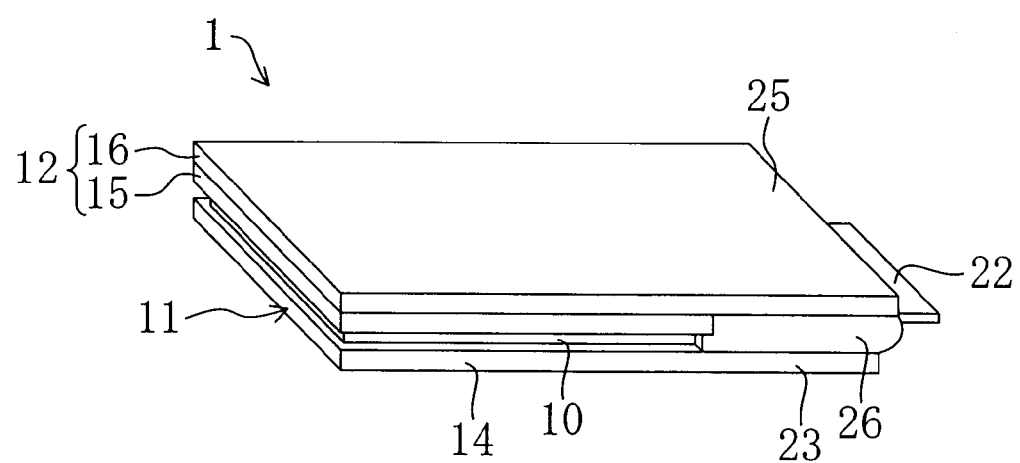
FIG. 23 is a perspective view illustrating the liquid crystal display device according to the fifth preferred embodiment of the present invention.

FIGS. 20 to 23 show a fifth preferred embodiment of the present invention. FIGS. 20 to 22 are sectional views illustrating the schematic structure of a liquid crystal display device 1 and FIGS. 21 to 23 are perspective views illustrating the appearance of the liquid crystal display device 1.

According to the present preferred embodiment, the extending region 25 protrudes outward beyond the mounting region 23 (in the extending direction of the FPC 22). Specifically, in the liquid crystal display device 1 shown in FIGS. 20 and 21, the extending region 25 includes a portion of the transparent plate 17 and the resin 26 is provided on the surface of the extending region 25 of the transparent plate 17 facing the mounting region 23. In the liquid crystal display device 1 shown in FIGS. 22 and 23, the extending region 25 includes a portion of the polarizer 16 and the resin 26 is provided on the surface of the extending region 25 of the polarizer 16 facing the mounting region 23.

As the extending region 25 protrudes greatly laterally beyond the mounting region 23, a larger area of the FPC 22 is supported by the resin 26. Therefore, a connection between the FPC 22 and the mounting region 23 is reinforced to a higher extent and the FPC 22 is more effectively prevented from falling off the mounting region 23.

Sixth Preferred Embodiment

Figure 24:
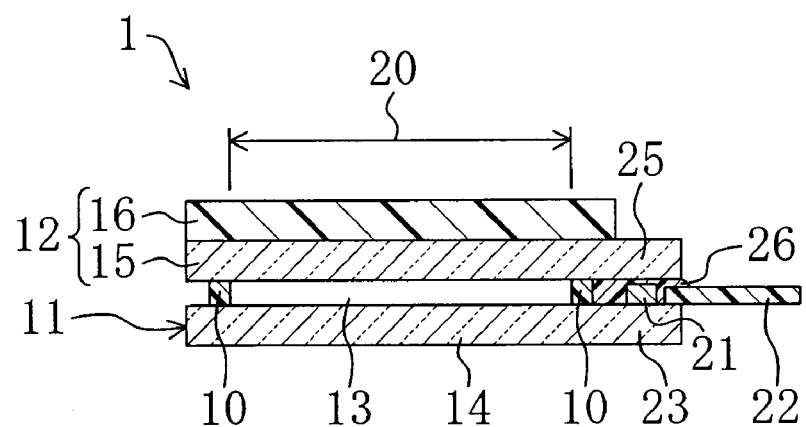
FIG. 24 is a sectional view illustrating the schematic structure of a liquid crystal display device according to a sixth preferred embodiment of the present invention.

FIG. 24 shows a fifth preferred embodiment of the present invention. FIG. 24 is a sectional view illustrating the schematic structure of a liquid crystal display device 1.

In the liquid crystal display device 1 of the present preferred embodiment, the extending region 25 includes a portion of the plastic plate 15 which is a flexible plate stacked on the surface of the polarizer 16 facing the liquid crystal layer 13. As shown in FIG. 24, the plastic plate 15 of the second substrate 12 of the present preferred embodiment is preferably shaped substantially the same as the plastic plate 14 of the first substrate 11 and they are bonded together to exactly overlap each other when viewed in plan. The resin 26 is provided to fill the space between the extending region 25 including a portion of the plastic plate 15 and the mounting region 23. According to the present preferred embodiment, the thicknesses of the circuit components 21 and 22 are smaller than the gap between the plastic plates 14 and 15. For example, the circuit component 21 is preferably a circuit directly formed in the plastic plate 14.

According to the present preferred embodiment, the same effects and advantages as those of the first preferred embodiment is obtained and the extending region 25 is provided using the plastic plate 15 of the liquid crystal display device 1. This is preferable because there is no need to provide additional components.

Seventh Preferred Embodiment

Figure 25:
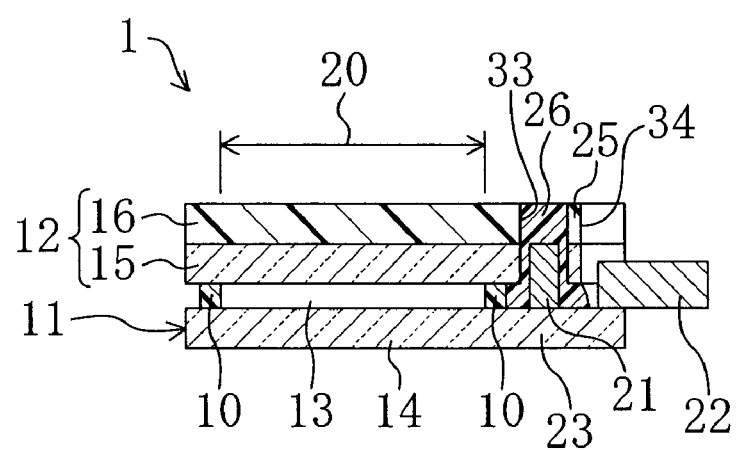
FIG. 25 is a sectional view illustrating the schematic structure of a liquid crystal display device according to a seventh preferred embodiment of the present invention.
Figure 26:
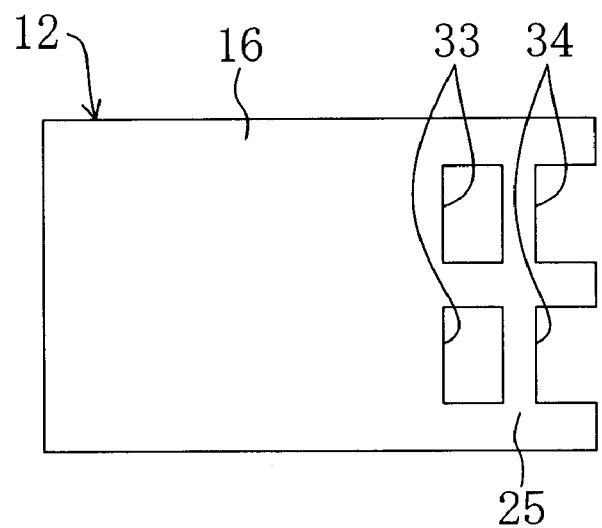
FIG. 26 is a plan view illustrating a second substrate according to the seventh preferred embodiment of the present invention.
Figure 27:
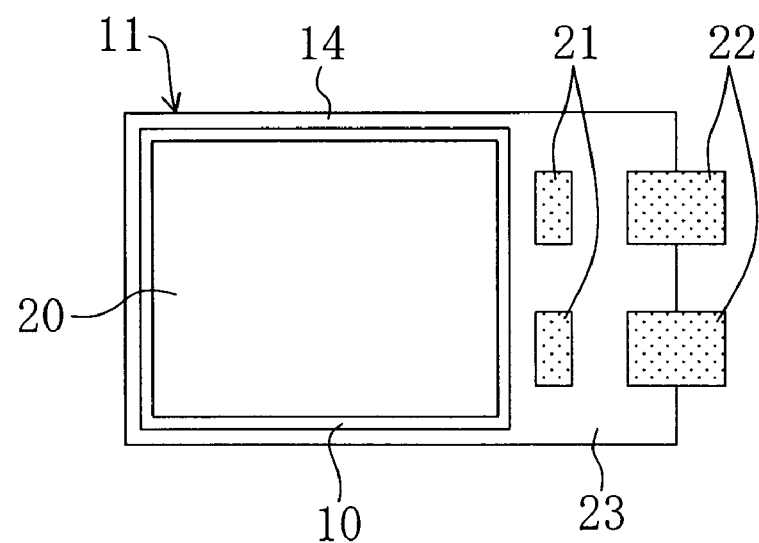
FIG. 27 is a plan view illustrating a first substrate according to the seventh preferred embodiment of the present invention.
Figure 28:
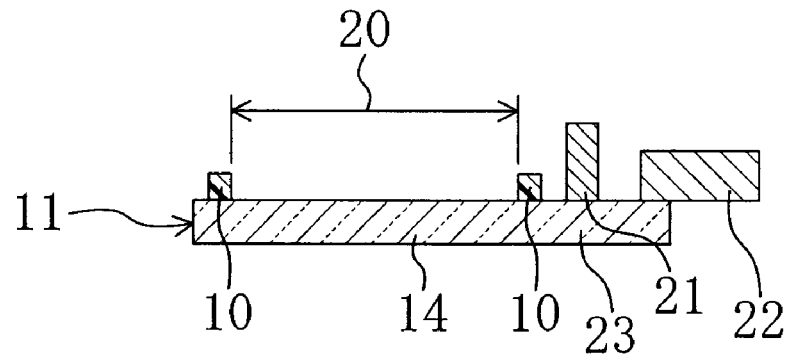
FIG. 28 is a sectional view illustrating a step of manufacturing the liquid crystal display device of the seventh preferred embodiment of the present invention.
Figure 29:
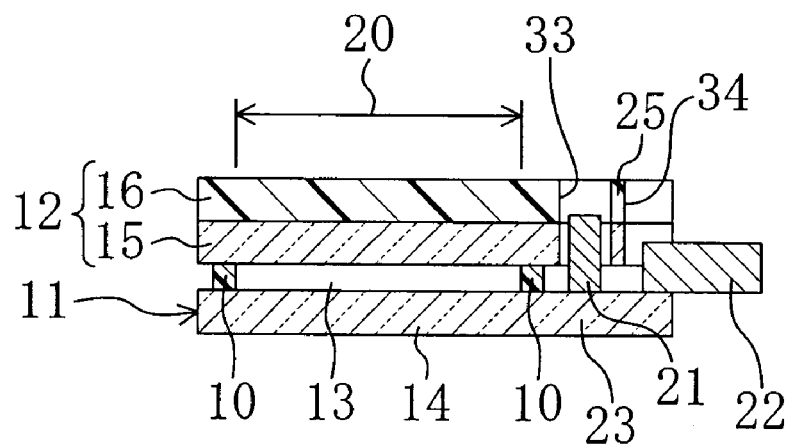
FIG. 29 is a sectional view illustrating a step of manufacturing the liquid crystal display device of the seventh preferred embodiment of the present invention.

FIGS. 25 to 29 show a seventh preferred embodiment of the present invention. FIG. 25 is a sectional view illustrating the schematic structure of a liquid crystal display device 1. FIG. 26 is a plan view illustrating the second substrate 12 and FIG. 27 is a plan view illustrating the first substrate 11. FIGS. 28 and 29 are sectional views illustrating the steps of manufacturing the liquid crystal display device 1.

In the present preferred embodiment, openings 33 and 34 are formed in the second substrate 12 to penetrate the second substrate 12 in the thickness direction such that at least portions of the circuit components 21 and 22 are inserted therein. That is, the plastic plate 15 and the polarizer 16 forming the second substrate 12 are shaped substantially the same as the first substrate 11 and arranged to exactly overlap each other when viewed in plan. As the circuit components 21 and 22, two IC chips 21 and two FPCs 22 preferably are provided on the mounting region 23 of the first substrate 11.

As shown in FIGS. 26 and 27, first openings 33 are formed in portions of the plastic plate 15 and the polarizer 16 facing the IC chips 21. The second openings 34 are also formed in portions of the plastic plate 15 and the polarizer 16 facing the FPCs.

Then, as shown in FIG. 25, with the first substrate 11 and the second substrate 12 bonded together, portions of the IC chips 21 are inserted in the first openings 33 and portions of the FPCs 22 are inserted in the second openings 34. The resin fills the first openings 33. That is, the resin 26 is continuously provided in the first openings 33 and on the mounting region 23. The resin 26 may be introduced in not only the first openings 33 but also the second openings 34.

For the manufacture of the liquid crystal display device 1 of the present preferred embodiment, the annular sealing member 10 is formed on the first substrate 11 and the IC chips 21 and the FPCs 22 are mounted on the mounting region 23 as shown in FIG. 28. At the same time, as shown in FIG. 26, the first and second openings 33 and 34 are formed in the second substrate 12 prepared by bonding the plastic plate 15 and the polarizer 16. The gap between the plastic plates 14 and 15 is about 5 μm, for example.

Then, as shown in FIG. 29, the liquid crystal layer 13 is provided between the first and second substrates 11 and 12 and the first and second substrates 11 and 12 are bonded together. Then, as shown in FIG. 25, the resin 26 such as a photo-curing resin is provided on the mounting region 23 and in the first openings 33 and ultraviolet light is applied to cure the resin 26.

According to the present preferred embodiment, even if the thicknesses of the IC chips 21 and the FPCs 22 are larger than the thickness of the liquid crystal layer 13, the IC chips 21 and the FPCs 22 are inserted in the first openings 33 and the second openings 34, respectively. Therefore, the extending region 25 facing the mounting region 23 is formed using the plastic plate 15 of the second substrate 12. Further, as the resin 26 fills the first openings 33, the adhesion between the extending region 25 and the mounting region 23 by the resin 26 is enhanced.

Eighth Preferred Embodiment

Figure 31:
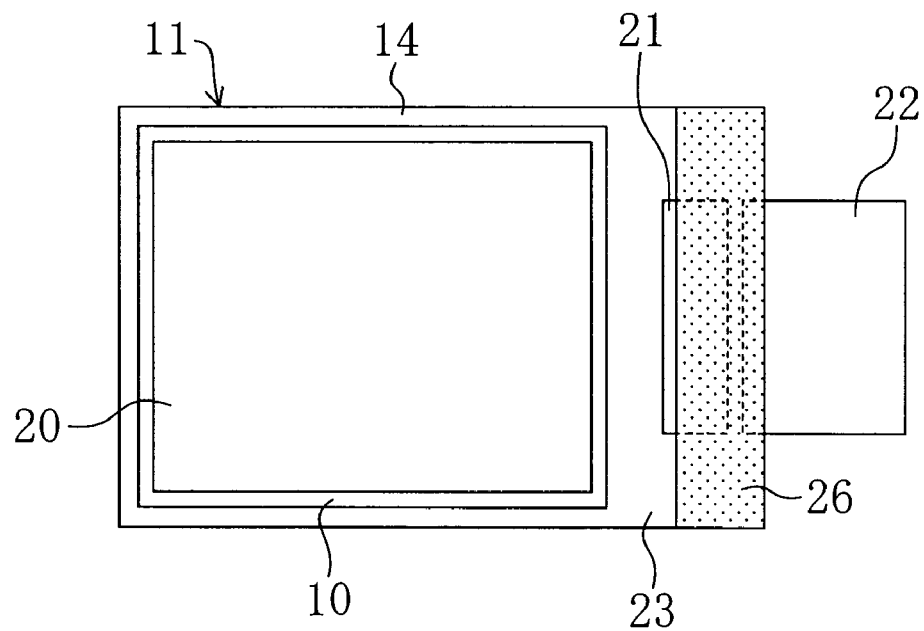
FIG. 31 is a plan view illustrating the liquid crystal display device according to an eighth preferred embodiment from which a second substrate is omitted.
Figure 32:
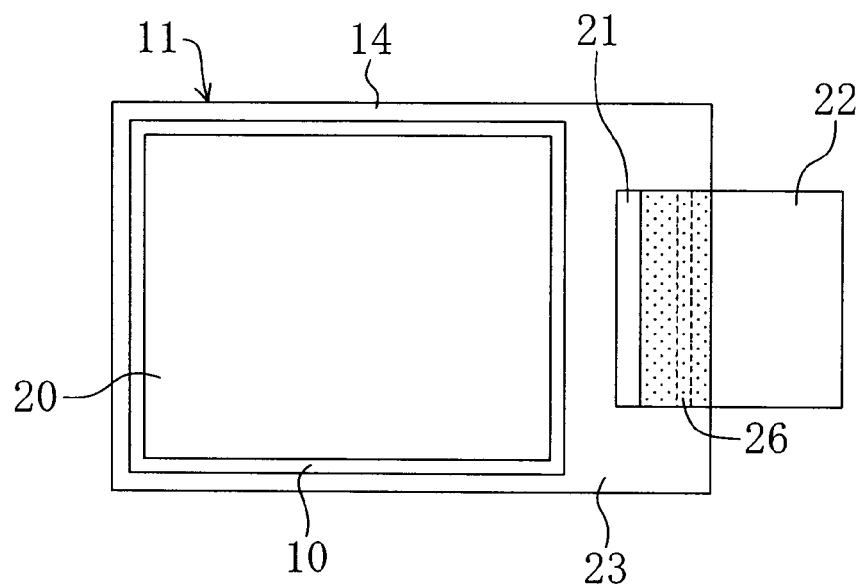
FIG. 32 is a plan view illustrating the liquid crystal display device of the eighth preferred embodiment from which the second substrate is omitted.
Figure 33:
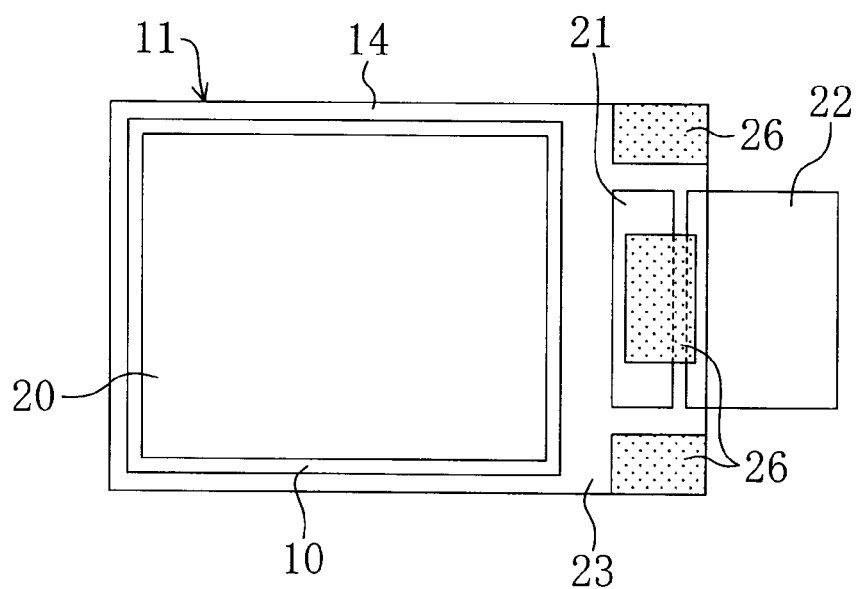
FIG. 33 is a plan view illustrating the liquid crystal display device of the eighth preferred embodiment from which the second substrate is omitted.

FIGS. 31 and 33 show an eighth preferred embodiment of the present invention. FIGS. 31 to 33 are plan views illustrating a liquid crystal display device 1 from which the second substrate 12 is omitted.

The present preferred embodiment shows the variations of how the resin 26 is introduced between the mounting region 23 and the extending region 25. It is not always necessary that the resin 26 fills the entire space between the mounting region 23 and the extending region 25.

For example, in the space between the extending region 25 and the mounting region 23 overlapping each other, the resin 26 may be provided in an edge portion of the space opposite the display area 20 as shown in FIG. 31. The edge portion 36 is a strip-shaped portion extending along the side edge of the first substrate 11.

As shown in FIG. 32, the resin 26 may also be provided to fill at least space between the IC chip 21 and the FPC 22. Alternatively, as shown in FIG. 33, the resin 26 may be provided at least a portion of the edge portion 36 of the space between the extending region 25 and the mounting region 23 overlapping each other.

With the above-described configurations, the concentration of the bending stress on a portion of the first substrate 11 on which the sealing member 10 is provided is prevented, while the resin 26 is removed from space between the edge portion 36 and the sealing member 10.

Ninth Preferred Embodiment

Figure 34:
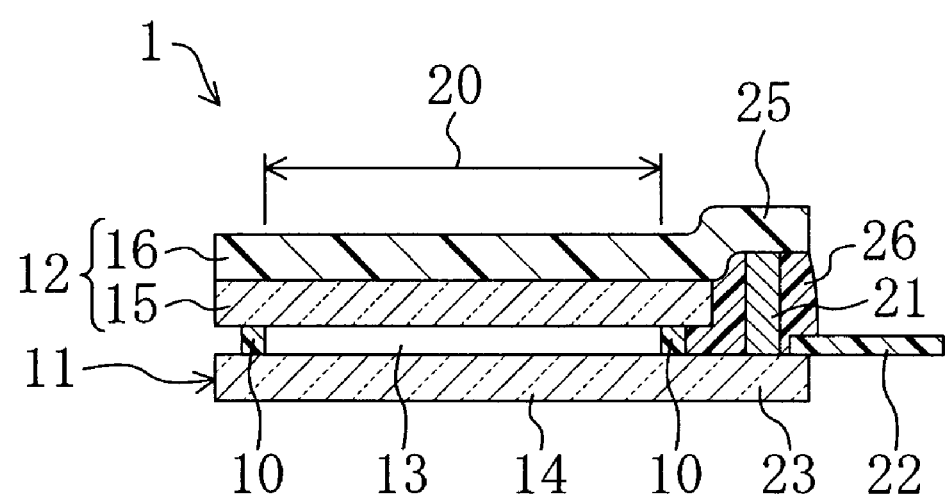
FIG. 34 is a sectional view illustrating the schematic structure of a liquid crystal display device according to a ninth preferred embodiment of the present invention.

FIG. 34 shows a ninth preferred embodiment of the present invention. FIG. 34 is a sectional view illustrating the schematic structure of a liquid crystal display device 1.

According to the present preferred embodiment, as shown in FIG. 34, the IC chip 21 which is relatively thick protrudes from the plastic plate 15 of the second substrate 12 in the direction opposite the liquid crystal layer 13. The extending region 25 includes a portion of the polarizer 16. The polarizer 16 is configured such that a portion of the polarizer 16 stacked on the plastic plate 15 and the extending region 25 have a level difference. With this configuration, the surface of the extending region 25 facing the mounting region 23 is in contact with the IC chip 21. The resin 26 fills the space between the extending region 25 and the mounting region 23.

Even if the IC chip 21 protrudes beyond the plastic plate 15 in the direction opposite the liquid crystal layer 13, the polarizer 16 configured to have a level difference makes it possible to provide the extending region 25 without using an additional transparent plate. Further, there is no need of forming an opening in the polarizer 16.

Tenth Preferred Embodiment

Figure 35:
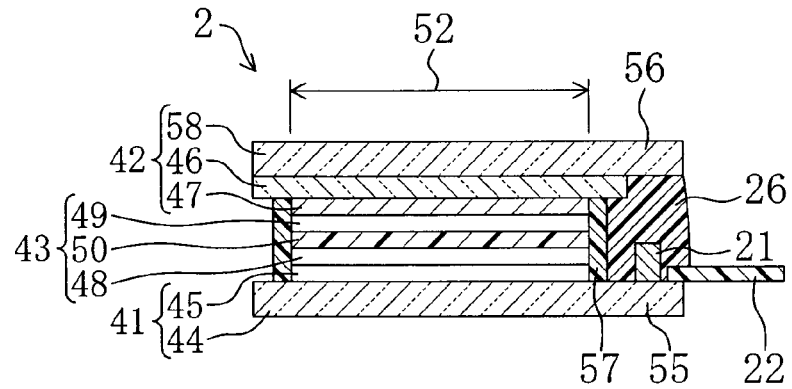
FIG. 35 is a sectional view illustrating the schematic structure of an organic EL display device according to a tenth preferred embodiment of the present invention.
Figure 36:
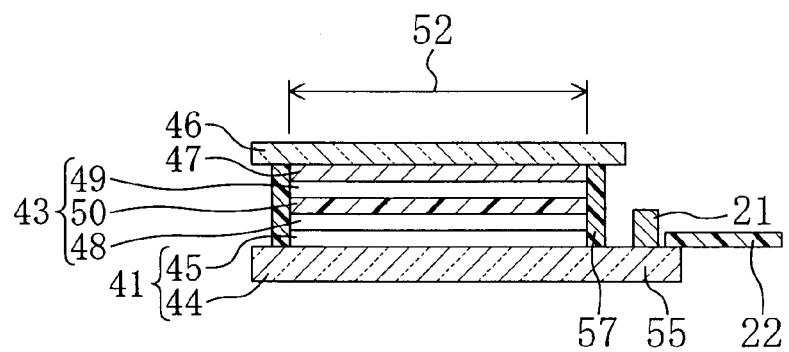
FIG. 36 is a sectional view illustrating a step of manufacturing the organic EL display device according to the tenth preferred embodiment of the present invention.
Figure 37:
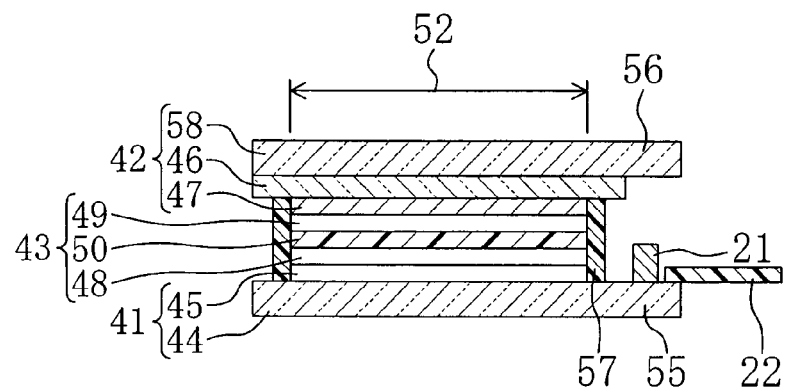
FIG. 37 is a sectional view illustrating a step of manufacturing the organic EL display device according to the tenth preferred embodiment of the present invention.
Figure 38:
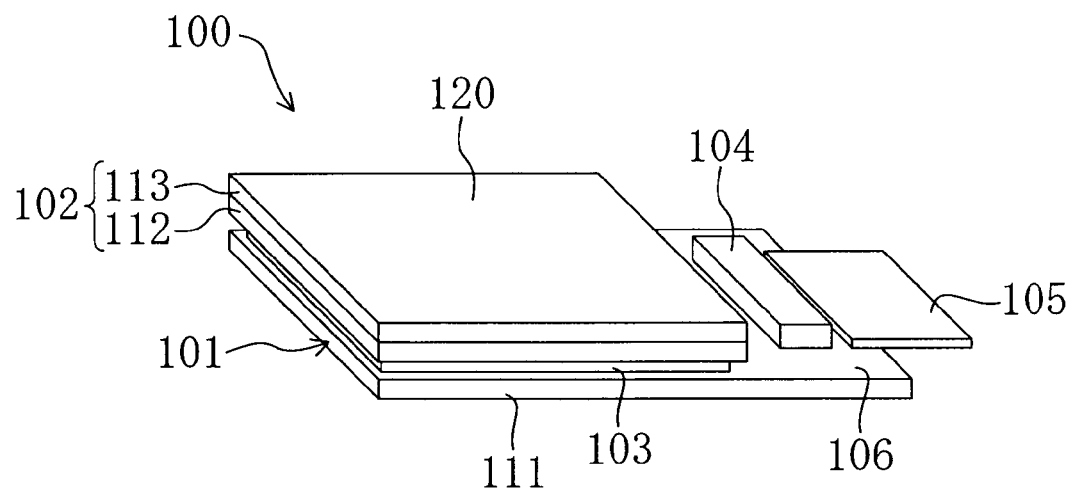
FIG. 38 is a perspective view illustrating a conventional liquid crystal display device.
Figure 39:
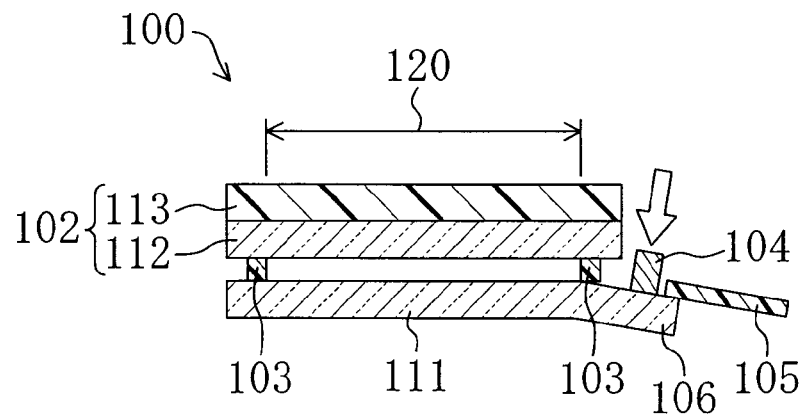
FIG. 39 is a sectional view illustrating the schematic structure of the conventional liquid crystal display device.

FIGS. 35 to 37 show a tenth preferred embodiment of the present invention. FIG. 35 is a sectional view illustrating the schematic structure of an organic EL display device 2. FIGS. 36 and 37 are sectional views illustrating the steps of manufacturing the organic EL display device.

The organic EL display device 2 includes a flexible first substrate 41 on which a plurality of switching elements (not shown) are formed, a second substrate 42 arranged to face the first substrate 41 and an organic EL layer 43 as a display medium layer provided between the first substrate 41 and the second substrate 42. The organic EL display device 2 performs display by emitting light produced by the organic EL layer 43 through the first substrate 41.

The first substrate 41 includes a rectangular or substantially rectangular, transparent and flexible plastic plate 44 and a transparent electrode 45 stacked on the surface of the plastic plate 44 facing the organic EL layer 43. The second substrate 42 includes a flexible protective plate 46 and a metal electrode 47 stacked on the surface of the protective plate 46 facing the organic EL layer 43. The second substrate 42 also includes a plastic plate 58 which is a flexible plate stacked on the surface of the protective plate 46 opposite the organic EL layer 43.

The organic EL layer 43 includes a hole transport layer 48 stacked on the surface of the transparent electrode 45, an electron transport layer 49 stacked on the surface of the metal electrode 47 and a light emitting layer 50 provided between the hole transport layer 48 and the electron transport layer 49.

The organic EL layer 43 is sealed between the plastic plate 44 and the protective plate 46 together with the transparent electrode 45 and the metal electrode 47 by an annular sealing member 51. The sealing member 51 may be made of a photo-curing resin or a thermosetting resin. An area in which the organic EL layer 43 is sealed with the sealing member 51 serves as a display area 52 which contributes to display.

The first substrate 41 includes a mounting region 55 formed outside the display area 52 for mounting on at least a portion thereof circuit components 53 and 54 electrically connected to the switching elements. The mounting region 55 is a portion of the first substrate 41 laterally protruding from the side of the sealing member 51 and rectangular-shaped when viewed in plan.

The second substrate 42 includes an extending region 56 extending to face the mounting region 55 of the first substrate 41. A resin 57 as an adhesive for bonding the extending region 56 and the mounting region 55 is provided in at least a portion of a space between the extending region 56 and the mounting region 55. The extending region 56 preferably includes a portion of the plastic plate 58.

In the same manner as the first preferred embodiment, the resin 57 may be, for example, a photo-curing resin TF-3348-15F3C manufactured by Hitachi Chemical, Co., Ltd. Other than the photo-curing resin, a thermosetting resin and a thermoplastic resin may also be used as the resin 57.

For the manufacture of the organic EL display device 2, the transparent electrode 45 and the hole transport layer 48 are formed on the plastic plate 44 and then the light emitting layer 50 is formed by ink jet printing. At the same time, the metal electrode 47 and the electron transport layer 49 are formed on the protective plate 46. Then, as shown in FIG. 36, the plastic plate 44 and the protective plate 46 are bonded and the metal electrode 47, the transparent electrode 45 and the organic EL layer 43 are sealed between the protective plate 46 and the plastic plate 44 by the sealing member 51.

As shown in FIG. 37, the plastic plate 58 is bonded to the outer surface of the protective plate 46. The plastic plate 58 is preferably shaped substantially the same as the plastic plate 44 of the first substrate 41. Then, as shown in FIG. 35, the photo-curing resin 57 is supplied to fill the space between the extending region 56 and the mounting region 55 and ultraviolet light is applied to cure the resin.

Just like the device of the first preferred embodiment, the organic EL display device 2 of the present preferred embodiment makes it possible to prevent the concentration of bending stress on a portion of the first substrate 41 on which the sealing member 51 is provided. Therefore, the sealing member 51 is less likely to fall off and the reduction of display quality is prevented.

Other Preferred Embodiments

In the organic EL display device 2 of the tenth preferred embodiment, the extending region 56 of the plastic plate 44 of the second substrate 42 may be provided with a rough surface in the same manner as the first preferred embodiment or through holes may be formed in the extending region 56 in the same manner as the second preferred embodiment. When the viscosity of the resin 57 is relatively high, the resin 57 is provided on the mounting region 55 first, and then the second substrate 42 is bonded thereon in the same manner as the fourth preferred embodiment. The extending region 56 may be configured to greatly protrude toward the mounting region 55 in the same manner as the fifth preferred embodiment. Further, a portion of the protective plate 46 may be used as the extending region 56 instead of providing the plastic plate 58 in the same manner as the sixth preferred embodiment. An opening into which the IC chip 53 is inserted may be formed in the protective plate 46 in the same manner as the seventh preferred embodiment. Further, the protective plate 46 may be formed to have a level difference in the same manner as the ninth preferred embodiment.

The present invention is not limited to the liquid crystal display device and the organic EL display device and can be applied to any other display devices including a flexible first substrate and a second substrate arranged to face the first substrate.

As described above, preferred embodiments of the present invention are useful for display devices having a flexible plate and particularly suitable for preventing the sealing member from falling off the flexible plate and preventing the reduction of display quality.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A display device comprising:
 a flexible first substrate on which a plurality of switching elements are located;
 a second substrate arranged to face the first substrate;
 a sealing member arranged to seal a display medium layer between the first substrate and the second substrate; and
 a mounting region provided in a portion of the first substrate outside a display area in which the display medium layer is sealed, the mounting region mounting on at least a portion thereof a circuit component electrically connected to the switching elements; wherein
 the second substrate includes an extending region extending to face the mounting region of the first substrate;
 an adhesive arranged to bond the extending region and the mounting region is provided in at least a portion of a space between the extending region and the mounting region; and
 the second substrate includes a polarizer and the extending region includes a portion of the polarizer.

2. The display device of claim 1, wherein at least one of the surfaces of the mounting region and the extending region in contact with the adhesive is roughened.

3. The display device of claim 1, wherein a through hole is formed in a portion of at least one of the mounting region and the extending region in contact with the adhesive and the through hole is filled with the adhesive.

4. The display device of claim 1, wherein the second substrate includes a polarizer and a transparent plate stacked on a surface of the polarizer opposite the display medium layer and the extending region includes a portion of the transparent plate.

5. The display device of claim 1, wherein the extending region is configured to protrude outward beyond the mounting region.

6. The display device of claim 1, wherein an opening in which at least a portion of the circuit component is inserted is provided in the second substrate.

7. The display device of claim 1, wherein the adhesive fills the entire space between the extending region and the mounting region overlapping each other.

8. The display device of claim 1, wherein the adhesive is provided in an edge portion of the space between the extending region and the mounting region overlapping each other, the edge portion being on the edge of the space opposite the display area.

9. The display device of claim 1, wherein the circuit component includes an IC chip mounted on an approximate middle of the mounting region and a flexible plate mounted on the edge of the mounting region, and the adhesive is arranged to fill at least a space between the IC chip and the flexible plate.

10. The display device of claim 9, wherein the adhesive is arranged to fill at least a portion of an edge portion of the space between the extending region and the mounting region overlapping each other.

11. The display device of claim 1, wherein the display medium layer is a liquid crystal layer.

12. The display device of claim 1, wherein the display medium layer is an organic EL layer.

* * * * *